United States Patent [19]

Kawasaki et al.

[11] Patent Number: 4,795,529
[45] Date of Patent: Jan. 3, 1989

[54] PLASMA TREATING METHOD AND APPARATUS THEREFOR

[75] Inventors: Yoshinao Kawasaki, Yamaguchi; Hironobu Kawahara, Kudamatsu; Yutaka Kakehi, Hikari; Kado Hirobe, Koganei; Katsuyoshi Kudo, Kudamatsu, all of Japan

[73] Assignee: Hitachi, Ltd., Tokyo, Japan

[21] Appl. No.: 109,318

[22] Filed: Oct. 19, 1987

[30] Foreign Application Priority Data

Oct. 17, 1986 [JP] Japan .................. 61-245261

[51] Int. Cl.$^4$ .............. H01L 21/306; B44C 1/22; B05D 3/06; C23C 14/00
[52] U.S. Cl. .................... 156/643; 118/50.1; 118/623; 118/728; 156/345; 156/646; 156/657; 156/662; 204/192.25; 204/192.37; 204/298; 252/79.1; 427/38
[58] Field of Search ............ 156/345, 643, 646, 651, 156/653, 657, 659.1, 662; 204/192.11, 192.12, 192.37, 298, 192.25; 427/38, 39; 118/728, 50.1, 620, 623, 624; 252/79.1

[56] References Cited

U.S. PATENT DOCUMENTS 4,579,623  4/1986  Suzuki et al. ............... 156/651 X
4,622,094  11/1986  Otsubo ....................... 156/643 X

FOREIGN PATENT DOCUMENTS 56-37311  8/1981  Japan .
60-50923  3/1985  Japan .
61-13625  1/1986  Japan .
61-41132  9/1986  Japan .

*Primary Examiner*—William A. Powell
*Attorney, Agent, or Firm*—Antonelli, Terry & Wands

[57] ABSTRACT

This invention relates to a plasma treating method and apparatus therefor. The plasma treating method comprises rendering a gas having a critical potential plasmic under a reduced pressure and changing an acceleration voltage for accelerating ions in the plasma towards a sample interposing the critical potential. The plasma treating apparatus comprises means for rendering a gas having a critical potential plasmic under a reduced pressure and means for changing an acceleration voltage for accelerating ions in the plasma towards a sample interposing the critical potential. According to the present invention, the etching step and the film formation step can be carried out alternately and the plasma treating time can be shortened.

32 Claims, 8 Drawing Sheets

PLASMA TREATING METHOD AND APPARATUS THEREFOR

BACKGROUND OF THE INVENTION

1. Field of the Invention

This invention relates to a plasma treating method and apparatus therefor, and more particularly to a plasma treating method and apparatus therefor which will be suitable for carrying out the treatment by effecting alternately etching and deposition.

2. Description of the Prior Art

With a progress in miniaturization of semiconductor devices, dimensional machining accuracy of circuit patterns and a low damage machining method have become more and more important. Particularly in devices of a submicron range, the device structure has become three-dimensional owing to limitation to a chip area. For this reason, it has become necessary to form a film having a large ratio of a machining depth to a machining width, that is, an aspect ratio, with high dimensional accuracy.

An example of prior art techniques for satisfying such a requirement is disclosed in Japanese Patent Laid-Open No. 50923/1985, for example. This prior art technique uses a mixed gas consisting of an $SF_6$ gas which contributes to etching, an $N_2$ gas which contributes to the formation of a protective film of silicon nitride and other gases as an etching gas for etching poly-Si, and changes periodically the composition and concentration of the treating gas during the etching treatment. In this manner, this prior art technique carries out etching at a high speed and with high dimensional accuracy by repeating alternately the etching step and the formation step of the silicon nitride protective film.

Since the prior art technique carries out the etching treatment by changing the gas composition and concentration, however, the condition of plasma changes whenever the gas composition and concentration are changed. When the gas composition and concentration are changed, a previous plasma condition is changed to a new plasma condition. In other words, any remaining ions and radicals must be exhausted rapidly. Since a treating vessel has a certain inner capacity, a certain period of time is necessary before the plasma condition is changed over so that the overall treating time becomes elongated. If this problem is to be somewhat alleviated, an exhaust device becomes greater in size to reduce the exhaust time. In addition, it becomes necessary to control the exhaust quantity during the treatment and the exhaust quantity at the time of change-over so that a controller and control technique become complicated.

On the other hand, a technique which changes the voltage to be impressed upon an electrode is disclosed in Japanese Patent Publication No. 41132/1986, Japanese Patent Laid-open No. 13625/1986, and the like. These prior arts carry out the plasma treatment by changing the voltage to be applied to the electrode, and merely improve plasma characteristics such as an etching rate, a selection ratio, and the like, by controlling the incidence energy of ions in the plasma.

SUMMARY OF THE INVENTION

It is therefore an object of the present invention to provide a plasma treating method and apparatus therefor which carries out alternately the etching step and the film formation step and can shorten the plasma treating time without changing over the treating gas.

As a result of intensive studies and experiments, the inventors of the present invention have found out for the first time the following observation as the basis of the present invention. A certain kind of component gas is rendered plasmic under a predetermined plasma condition. An acceleration voltage is applied to ions inside this plasma and arranged in such a manner that the ions are incident to a sample. The present invention treats the sample by use of such a plasma. The inventors of the invention have found out that if the value of the acceleration voltage is changed in this case, there exist a voltage at which the etching action occurs preferentially and a voltage at which the deposition action occurs preferentially. It has been found also that there is a voltage at which the etching action is in equilibrium with the deposition action. Hereinafter, this equilibrium voltage will be referred to as a "critical potential".

Namely, the present invention provides an apparatus comprising means for rendering plasmic a gas having a critical potential under a reduced pressure and means for changing an acceleration voltage for accelerating ions in the plasma towards a sample while interposing the critical potential, and a treating method including a step of rendering plasmic a gas having a critical potential under a reduced pressure and a step of changing an acceleration voltage for accelerating ions in the plasma towards a sample interposing the critical potential. Thus, the present invention can shorten the plasma treating time by alternately carrying out the etching step and the film formation step without changing over the treating gas.

DETAILED DESCRIPTION OF THE PREFERRED EMBODIMENTS

First of all, the first embodiment of the present invention will be described with reference to FIGS. 1 to 6.

Figure 1:
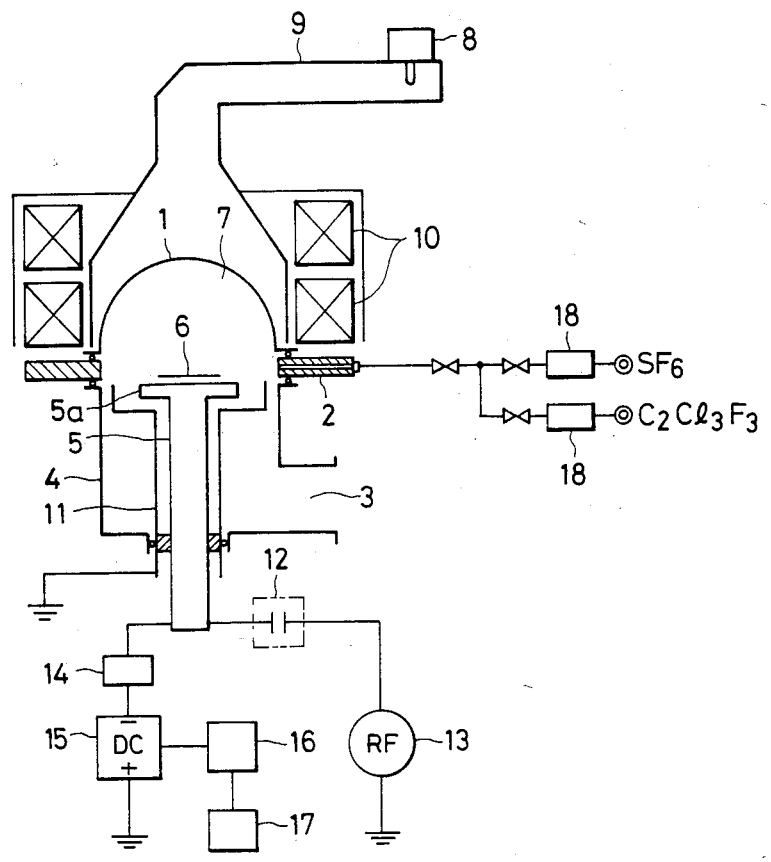
FIG. 1 is a structural view showing a plasma treating apparatus in accordance with one embodiment of the present invention.

FIG. 1 shows a microwave plasma treating apparatus using ECR discharge, which is an etching apparatus in this case. A discharge tube 1 made of silica is disposed at an upper opening of a vacuum treating vessel 4. An exhaust portion 3 which is connected to a vacuum exhaust device, not shown, is disposed at the lower part of the vacuum treating vessel 4. An electrode 5 having a sample table 5a, on which a wafer 6 as a sample is placed, is disposed inside the vacuum treating vessel 4. A discharge space 7 is formed above the sample table 5a inside the discharge tube 1.

A waveguide 9 is disposed above the discharge tube 1 and encircles the tube 1. A magnetron 8 which generates a 2.45 GHz microwave in this case is disposed at the end portion of the waveguide 9. An electromagnetic coil 10 is disposed around the outer periphery of the discharge tube 1 through the waveguide 9.

A gas introduction portion 2 for supplying an etching gas into the discharge space 7 is disposed sideways of the vacuum treating vessel 4 and communicated with a gas source, not shown, through a mass flow controller 18.

A ground electrode 11 is disposed around the outer periphery of the electrode 5 and electrically insulated therefrom. One end of this ground electrode 11 is positioned near the sample table 5a while the other end is grounded. A radio frequency power source 13 which oscillates a 13.56 MHz radio frequency in this case is connected to the electrode 5 through a matching box 12 while a D.C. power source 15 is connected to the electrode 5 through a low-pass filter 14. The other ends of the radio frequency power source 13 and the D.C. power source 15 are each grounded. A voltage controller 16 is connected to the D.C. power source 15 and an output waveform controller 17 is connected to the output voltage controller 16. The matching box 12 consists of capacitor coupling in this case. The low-pass filter 14 is to cut off the radio frequency voltage from the radio frequency power source 13.

The mass flow controller 18 controls the etching gas from the gas source, not shown, to a predetermined flow rate and sends the etching gas into the discharge space 7. The inside of the discharge space 7 is evacuated to a reduced pressure by an exhaust device, not shown, and held at a predetermined pressure.

In this case, a means for rendering plasmic the etching gas introduced into the discharge space consists of the magnetron 8 and the electromagnetic coil 10. The etching gas inside the discharge space 7 is rendered palsmic by the ECR discharge resulting from the action of the electromagnetic field provided by the magnetron 8 and the electromagnetic coil 10.

A means for applying incident energy to the wafer 6 to the ions in the plasma, that is, a means for generating an acceleration voltage in the sample table 5a in this case, consists of the radio frequency power source 13 and the D.C. power source 15. The radio frequency voltage from the radio frequency power source 13 and the D.C. voltage from the D.C. power source 15 are applied to the sample table 5a on which the wafer 6 is placed. When the radio frequency voltage is applied to the sample table 5a through the matching box 12 consisting of the capacitor coupling, the radio frequency voltage is given D.C.-wise and floatingly so that a D.C. bias voltage occurs. This D.C. bias voltage attracts the ions in the plasma towards the sample table 5a, that is, towards the wafer 6. The wafer 6 is sputter-etched by the incidence energy of the ions at this time. Since the D.C. voltage is applied to the sample table 5a, the value of the D.C. bias voltage occurring on the sample table 5a is adjusted. In this case, this D.C. bias voltage becomes the acceleration voltage for accelerating the ions.

Furthermore, a means for changing the value of the acceleration voltage generated on the sample table 5a interposing the critical potential consists of the voltage controller 16 and the output waveform controller 17, and the output voltage controller 16 controls the D.C. voltage value of the D.C. power source 15. The output waveform controller 17 controls the timing for changing the D.C. voltage value which the output voltage controller 16 controls. The timing is controlled periodically in this case.

The wafer 6 in this case is produced by depositing a poly-Si layer that is a wiring forming material on a Si substrate. The etching apparatus of this embodiment uses a mixed gas of sulfur hexafluoride ($SF_6$) and trichlorotrifluoroethane ($C_2Cl_3F_3$: "Flon - 113", tradename) as the etching gas and etches the poly-Si layer of the wafer 6.

Next, the experiment wherein both components of the etching gas described above, that is, $SF_6$ and $C_2Cl_3F_3$, are rendered palsmic under the same plasma formation condition (microwave power: 400 W, gas flow rate: 70 sccm, pressure: 0.01 Torr, radio frequency power: 100W) in the etching apparatus described above and the D.C. bias voltage applied to the sample table 5a is changed will be explained with reference to FIG. 2.

Figure 2:
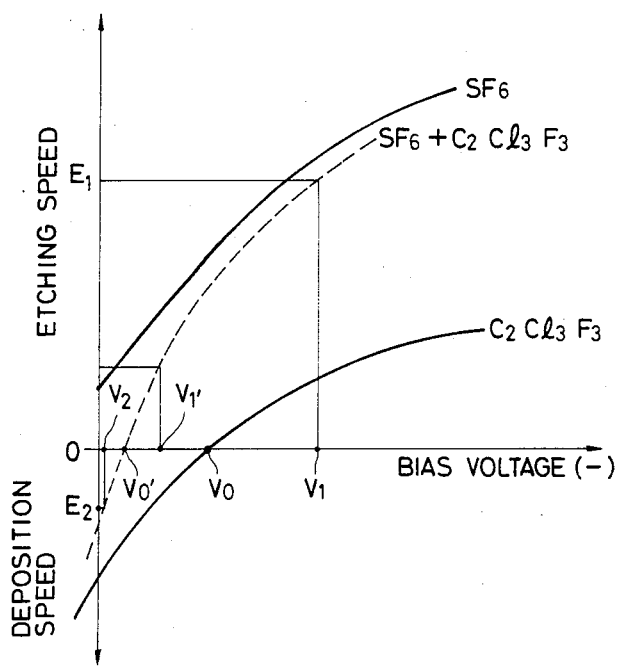
FIG. 2 is a diagram showing the relationship between a bias voltage in a treating gas and an etching speed or a deposition speed.
Figure 3:
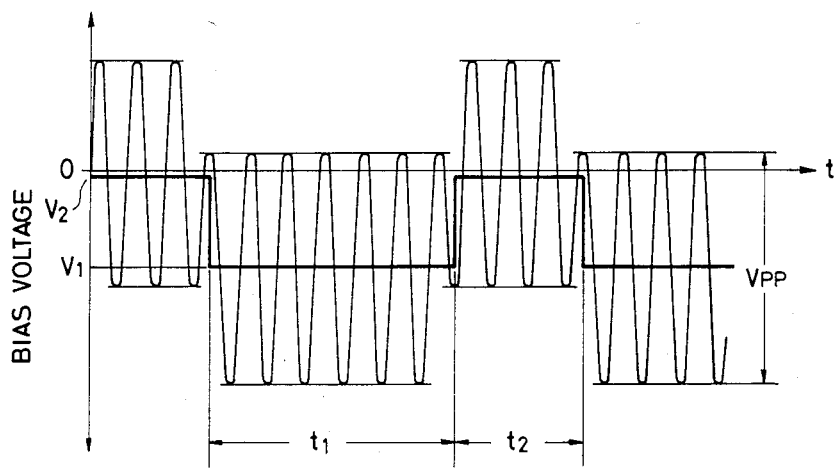
FIG. 3 is a diagram showing the impressing pattern of an acceleration voltage in the apparatus shown in FIG. 1.

In the graph of FIG. 2, the etching speed is plotted at the upper part of the ordinate while the deposition speed is plotted at its lower part. The D.C. bias voltage is plotted on the abscissa.

As is obvious from FIG. 2, $SF_6$ always causes the etching phenomenon irrespective of the magnitude of the D.C. bias voltage and the etching speed increases with an increasing D.C. bias voltage.

On the other hand, $C_2Cl_3F_3$ causes the deposition phenomenon within the range where the D.C. bias voltage is small and the etching phenomenon within the range where D.C. bias is great. Furthermore, it can be seen from the diagram that $C_2Cl_3F_3$ has a critical potential (Vo) exactly at its boundary where neither etching nor deposition occur.

Incidentally, the term "critical potential" used hereby means the potential at which the deposition phenomenon and the etching phenomenon reverse each other when the gas is rendered palsmic and the D.C. bias voltage is changed, and is found out for the first time through the experiments conducted by the inventors of the present invention.

This means the following: When $C_2Cl_3F_3$ is rendered plasmic, the deposition action and the etching action occur concurrently. At this time, if the D.C. bias voltage applied to the sample table $5a$ is smaller than the critical potential, the deposition action occurs preferentially. If the D.C. bias voltage applied to the sample table $5a$ is increased within the range where it is smaller than the critical potential, the ions in the plasma are accelerated with the increase of the D.C. bias voltage, the etching action becomes gradually stronger and priority of the deposition action decays gradually. If the D.C. bias voltage increases beyond the critical potential, the ions in the plasma are further accelerated and the etching action occurs more preferentially than the deposition action so that the etching action becomes gradually stronger. If the D.C. bias voltage is equal to the critical potential, the deposition action and the etching action are in equilibrium with each other.

A similar experiment was carried out by use of a mixed gas of $SF_6$ not having the critical potential described above and $C_2Cl_3F_3$ having the critical potential (1: 9 mixture). The result is represented by dash line curve in FIG. 2. As is obvious from this dash line curve, the critical potential Vo' exists in this mixed gas, the deposition action occurs preferentially at a D.C. bias voltage lower than the critical potential Vo' and the etching action occurs preferentially at a D.C. bias voltage greater than the critical potential Vo'. Moreover, when this mixed gas is used, the etching speed depends more greatly on the D.C. bias voltage than when $C_2Cl_3F_3$ is used alone, as is obvious from the diagram. It is found out therefore that this mixed gas can be used as an etchant whose etching speed has high bias voltage dependence.

Next, the etching treatment using the mixed gas having such characteristics will be described with reference to FIGS. 2 to 6.

Figure 4:
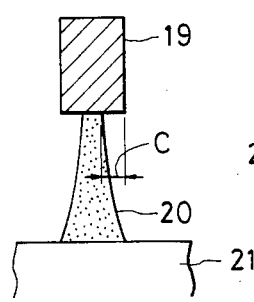
FIG. 4 is a schematic view showing the etching state when a bias voltage is not changed.
Figure 5:
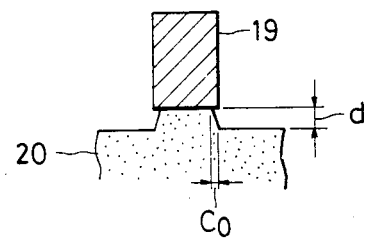
FIGS. 5 and 6 are schematic views showing the etching state in accordance with the present invention.

First of all, when a poly-Si film having a high aspect ratio is etched at a bias voltage value V1' higher than the critical potential Vo', an undercut C becomes greater as shown in FIG. 4 and dimensional accuracy cannot be secured. Here, reference numeral 19 represents a photoresist, 20 is polysilicon and 21 is the Si substrate.

Accordingly, the D.C. voltage which is to be superposed with the radio frequency voltage which floats D.C.-wise is controlled by the output voltage controller 16 and the output waveform controller 17 and the D.C. bias voltage is set to $V_1$ (negative potential) greater than the critical potential Vo' of the mixed gas for $t_1$ seconds and to $V_2$ (negative potential) smaller than the critical potential Vo' for $t_2$ second and changed periodically.

Since the D.C. bias voltage is great for the time $t_1$ seconds, etching can be made while accelerating the ions in the plasma towards the wafer 6 so that relatively anisotropic etching can be carried out. However, an undercut $C_0$ occurs somewhat due partially to the influences of free radicals. The size of this undercut $C_0$ is substantially from 1/5 to 1/10 of the etching depth d in the vertical direction. The time $t_1$ is set within the range which does not exceed the allowance of the undercut $C_0$.

Since the D.C. bias voltage value is smaller than the critical potential for the period $t_2$, deposition can be generated so that regression of etching stops, the plasma polymerization products start depositing on the entire surface of the wafer 6 and the protective film is formed on the wall surface on the pattern side of polysilicon 20.

After the protective film is formed, a large D.C. bias voltage $V_1$ is applied again to the sample table $5a$ to effect etching. The ions in the plasma accelerated by this large D.C. bias voltage $V_1$ are incident perpendicularly to the wafer 6. Accordingly, the protective film deposited at the pattern bottom of the polysilicon 20 formed by the photoresist 19 is removed rapidly by the sputter action of the ions and etching proceeds while the pattern bottom of polysilicon 20 is exposed. The protective film deposited on the wall surface on the pattern side of polysilicon 20 is attacked by free radicals having extremely small physical energy and removed gradually by the chemical reaction between the free radicals and the components of the composition of the protective film. The deposition time $t_2$ of the protective film is set so that the protective film deposited on the wall surface on the pattern side of polysilicon 20 remains even when etching is effected for the period $t_1$. Incidentally, the time $t_1$ and $t_2$ thus set are stored in advance in the output waveform controller 17 and automatically changed over.

Figure 6:
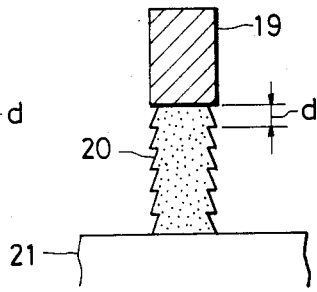

The polysilicon film having a high aspect ratio shown in FIG. 6 can be machined with high dimensional accuracy by alternately repeating the etching step and the deposition step, that is, the film formation step, in the manner described above.

Incidentally, the value of the large D.C. bias voltage $V_1$ is set to be smaller than ½ of the total amplitude value $V_{pp}$ of the radio frequency voltage in order to prevent charge-up of the ions to the sample. For there is a limitation to the D.C. voltage to be superposed with the radio frequency voltage in order to obtain a high etching speed and moreover to effect etching without applying any damage to the device formed on the sample.

Namely, if the D.C. bias voltage value (negative potential) is increased to be greater than ½ of the total amplitude value $V_{pp}$ of the radio frequency voltage, the sample is always at a negative potential, only the positive ions are attracted to the sample surface and the sample is charged. Accordingly, the positive ions (reactive ions) in the plasma become finally repulsive and do not reach the sample, resulting in a drastic drop of the etching speed of the sample: If the charge potential is great at this time, degradation and breakdown of the gate portion of the device formed on the sample will occur.

Therefore, this embodiment applies a negative D.C. voltage smaller than ½ of the total amplitude value $V_{pp}$ of the radio frequency voltage to the sample table $5a$ so that part of the waveform of the radio frequency voltage remains as the positive potential and this positive potential portion entraps the electrons in the plasma, thereby neutralizing the positive ions charged to the sample.

Furthermore, in order to solve this problem of charge-up, the transmission frequency of the radio frequency voltage must be increased above about 100 KHz, as described in detail in Japanese Patent Publication No. 37311/1981. Though there is no limitation, in particular, to the upper limit of the transmission frequency, an oscillation frequency of up to about 27 MHz will be suitable if oscillators that are commercially available on the market are used.

In accordance with the first embodiment of the invention described above, the radio frequency voltage is applied to the electrode 5 by the radio frequency power source 13 in such a manner as to superpose the D.C. voltage from the D.C. power source 15 with the D.C. bias voltage generated in the sample table 5a by the application of the radio frequency voltage and the D.C. bias voltage having superposed the D.C. voltage therewith is changed in such a manner as to interpose the critical potential by the output voltage controller 16 as well as the output waveform controller 17. In this manner, etching and deposition, that is, film formation, can be effected alternately to the wafer without changing the plasma generated in the discharge portion 7, that is, without supplying the gas by changing it over. Accordingly, in comparison with the conventional technique which changes over the kind of gases and etches the sample by effecting alternately etching and deposition, the present invention eliminates the gas replacement time and can shorten the treating time effectively by at least the elimination of this gas replacement time. For instance, an about 10 seconds time is necessary when a gas of 70 SCCM is supplied to a vacuum treating vessel having a capacity similar to the capacity (20,000 cm$^3$) of the vacuum treating vessel of this embodiment by use of an exhaust device having an exhaust capacity of 500 l/sec, and the state described above is established by changing over the kind of gases from the state where the pressure is kept at 0.01 Torr. As the number of times of gas switching increases, the effect of the present invention becomes more remarkable. In other words, since it is not necessary in the present invention to change over the gas at a high speed as required by the prior art, the exhaust device can be made compact in size. Since the pressure control and the change-over control for the change-over of the gas kind become unnecessary in accordance with the present invention, the apparatuses and control techniques required therefor become simplified.

Since the output voltage controller 16 is controlled in such a manner as to apply the D.C. bias voltage greater than the critical potential to the sample table 5a, the wafer 6 is etched and if the D.C. bias voltage smaller than the critical potential is applied to the sample table 5a, the protective film is deposited on the wafer 6. Furthermore, the output waveform controller 17 is controlled in order to alternately change over the timings at which the D.C. bias voltage is changed, interposing the critical potential between them. Accordingly, etching can be made step-wise while protecting the etching side surface of the wafer 6 by the protective film and a material to be etched, which has a depth or height greater than the pattern dimensional width can be machined.

Since the embodiment utilizes the treatment by the microwave plasma using ECR discharge, the plasma can be generated at a pressure as low as $10^{-2}$ Torr, and since the ions in the plasma can be attracted by a small acceleration voltage to the wafer 6, anisotropic etching with less damage can be practised and a material to be etched, which has a delicate pattern, can be machined. In other words, the material to be etched having a delicate pattern and a great aspect ratio can be machined in cooperation with the effects described above.

The change-over timing of the etching action and the deposition action is set by the output waveform controller in such a manner that the undercut of the material to be etched is within the allowance at the time of etching and the protective film on the etching side surface remains till next etching at the time of deposition. Accordingly, machining can be made with high dimensional accuracy.

Since the plasma generation means utilizing the electromagnetic action is independent of the D.C. bias voltage application means provided by the radio frequency voltage and the D.C. voltage, that is, the acceleration voltage application means, the state of generation of the plasma, that is, the state of the electrons, ions and free radicals in the plasma, does not change even if the D.C. bias voltage is changed, so that etching can be made while light emission intensity is stable, and the end point of etching can be easily judged by light emission spectroscopy.

Moreover, the radio frequency power source 13 is connected to the sample table 5a to apply the radio frequency voltage and the D.C. voltage of the D.C. power source 15 is controlled so as to set the D.C. bias voltage to be below ½ of the total amplitude of the radio frequency voltage generated from the radio frequency power source 13. Accordingly, even if the sample has an insulating material or an insulating film, no charge is built up in the sample and etching can be made without the drop of the etching speed and degradation and breakdown of the gate portion of the device. If a device of a device structure having an MOS gate in a lower layer is etched by the etching method of the first embodiment of the invention, degradation of breakdown voltage and damage of the gate portion do not occur.

Incidentally, the ion sheath width is generally about 0.1 mm in microwave plasma treating apparatuses which cause discharge by the ECR system by utilizing the microwave as in the present embodiment. The time necessary for the ions to pass through this ion sheath ($t_i$) varies somewhat depending upon the kind of ions but is generally from about 1 to $4 \times 10^{-7}$ sec. In contrast, the half cycle time ($t_{RF}$) of the voltage waveform of the 13.56 MHz radio frequency that is generally used for industrial applications is $3.7 \times 10^{-8}$ sec. For this reason, in the 13.56 MHz radio frequency voltage, the ions cannot follow while passing through the ion sheath. Therefore, the ions can be accelerated by generating the negative D.C. bias voltage as in the present embodiment.

The method which utilizes the D.C. bias voltage is particularly effective when treating a sample which can establish conduction with the electrode 5, such as a Si or a metal film. The method of using the D.C. bias voltage becomes effective when the half cycle time $t_{RF}$ of the voltage waveform of the radio frequency and the ion sheath passage time of ions $t_i$ have the following relation:

$$t_{RF} < t_i$$

Accordingly, the lower limit of the frequency of the radio frequency power source 13 is about 2 MHz ($t_{RF} = 2.5 \times 10^{-7}$ sec). If the frequency is lower than this value, the ions follow up the A.C. voltage waveform and are accelerated so that the effect of superposition of the D.C. voltage and application of the superposed voltage to the electrode 5 by the D.C. power source 15 drops.

Incidentally, when the sample is electrically conductive, it is possible to remove the radio frequency power source 13 of this embodiment and to use only the D.C. power source 15 as the plasma treating apparatus.

Next, the second embodiment of the present invention will be described with reference to FIGS. 7 and 8.

Figure 7:
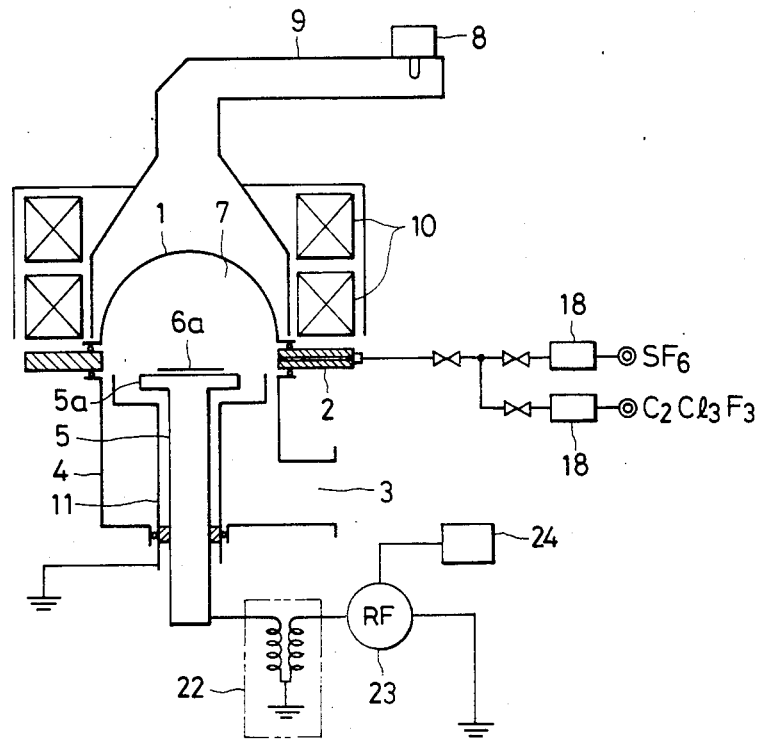
FIG. 7 is a structural view showing a plasma treating apparatus in accordance with the second embodiment of the present invention.

In FIG. 7, like reference numerals are used to identify like constituents as in FIG. 1. The difference of this drawing from FIG. 1 lies in that only a radio frequency power source 23 having a 385 KHz frequency is used as acceleration voltage providing means. The radio frequency power source 23 is connected to the electrode 5 through the matching box 22. In this case, one of the ends of the matching box circuit 22 is grounded so that the electrode 5 is at the ground potential D.C.-wise. The output voltage control means 24 is connected to the radio frequency power source 23.

Figure 8:
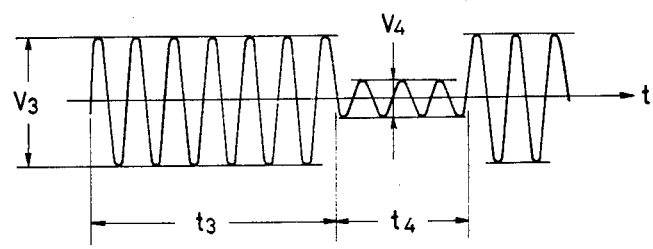
FIG. 8 is a diagram showing the impressing pattern of an acceleration voltage in the apparatus shown in FIG. 7.

The output voltage control means 24 controls the waveform of the radio frequency voltage outputted from the radio frequency power source 23 so that the total amplitude of the radio frequency voltage becomes $V_3$ for the time $t_3$ and becomes $V_4$ for the next time $t_4$ as shown in FIG. 8.

Using the plasma treating apparatus having the construction described above, that is, the etching apparatus in this case, the relationship between the etching speed of polysilicon and the output voltage of the radio frequency power source 23, that is, the accelerating voltage, is examined with the wafer 6a formed by sequentially laminating polysilicon and a photoresist through an about 50 nm-thick oxide film on the Si substrate, under the same condition as that of the first embodiment. As a result, the similar tendency could be observed as in FIG. 2.

Namely, a radio frequency voltage having a frequency below 2 MHz (385 KHz in this case) is applied by the radio frequency power source 28 to the sample table 5a so that the ions can sufficiently follow the A.C. voltage waveform, and the intensity of the A.C. voltage, that is, the total amplitude of the A.C. voltage, is changed. As a result, there appeared the state where the etching works preferentially, the state where deposition works preferentially and the state where neither etching nor deposition proceed, in the same way as in the first embodiment.

Therefore, etching of polysilicon is effected by controlling the output voltage of the radio frequency power source 23 by the voltage control means 24 as shown in FIG. 8 and applying a radio frequency voltage $V_3$ greater than the critical potential to the electrode 5 for the period $t_3$. Next, the protective film is formed on the surface of the wafer 6a (inclusive of the etching side surface) by applying a radio frequency voltage $V_4$ smaller than the critical potential to the electrode 5 for the period $t_4$. The material to be etched having a high aspect ratio can be machined with high dimensional accuracy by repeating both of these steps sequentially. Incidentally, the etching time $t_3$ and the deposition time $t_4$ may be set in the same way as the etching time $t_1$ and the deposition time $t_2$ in the first embodiment.

In accordance with the second embodiment described above, the output voltages of the radio frequency voltage having a frequency below 2 MHz are changed while interposing the critical voltage and in this manner, the etching step and the deposition step can be carried out alternately without changing over the supply of gases. Accordingly, the treating time can be effectively shortened in the same way as in the first embodiment.

The second embodiment uses the treating method utilizing the microwave plasma in the same way as in the first embodiment and carries out stepwise the etching step protecting the etching side surface of the wafer 6a by the protective film and while the etching time and the deposition time are controlled by the voltage control means 24. Accordingly, the material to be etched which has a greater depth or height than the pattern dimensional width of the delicate pattern can be machined with high dimensional accuracy.

Since the generation state of the plasma does not change and etching can be carried out while the light emission intensity remains stable in the same way as in the first embodiment, the end point of etching can be judged easily.

Furthermore, since the voltage for accelerating the ions is given in the negative voltage range of the radio frequency voltage having a frequency below 2 MHz, those positive ions which are accelerated in the negative voltage range and attracted and charged to the surface of the wafer 6a can be neutralized by those electrons which are attracted to the surface of the wafer 6a in the next positive voltage range, so that dielectric breakdown of the insulating material formed on the wafer 6a can be prevented. Accordingly, this embodiment is suitable for etching the sample having an insulating material such as $SiO_2$, $Si_3N_4$, or the like. In this case, since a kind of capacitor is formed between the electrode 5-wafer 6a- plasma, the charge will be built up too much in the wafer 6a if the frequency of the radio frequency voltage is too low, the acceleration of the ions is inhibited and the etching speed drops remarkably, thereby causing so-called "charge-up". The critical frequency for preventing this charge-up depends upon the kind and thickness of the insulating film, but the practical value of semiconductor devices is about 100 KHz, as described in detail in Japanese Patent Publication No. 37311/1981.

Next, the third embodiment of the present invention will be described with reference to FIGS. 9 and 10.

Figure 9:
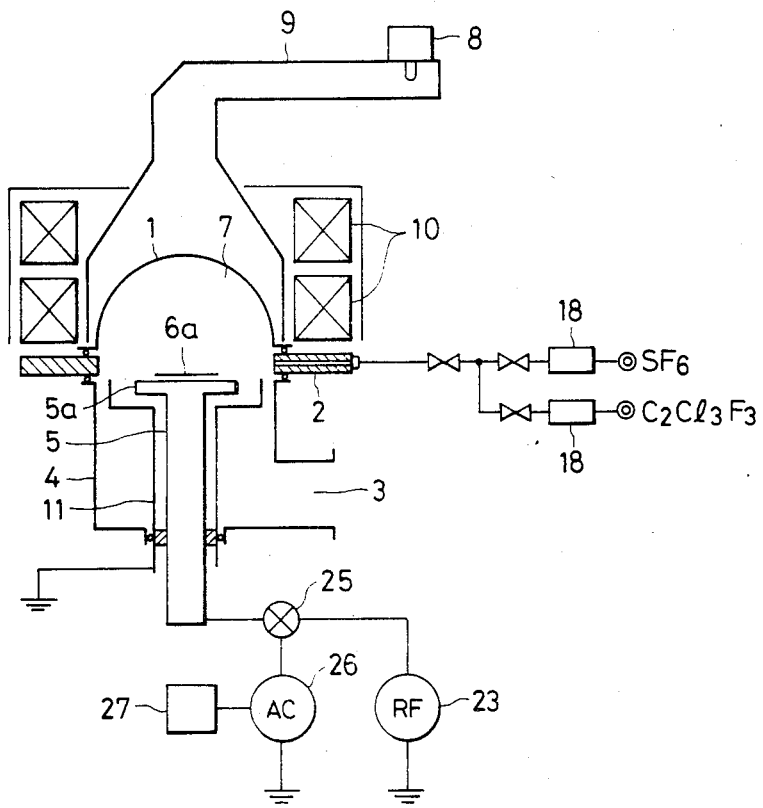
FIG. 9 is a structural view showing the plasma treating apparatus in accordance with the third embodiment of the present invention.
Figure 10:
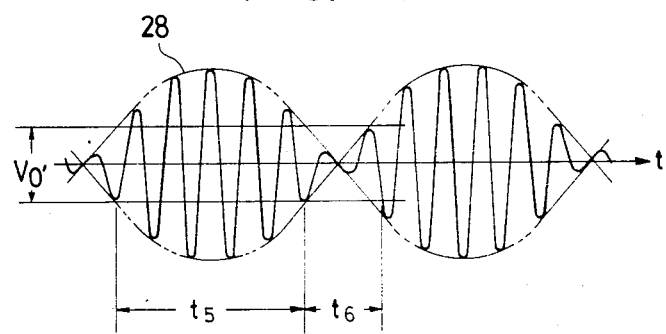
FIG. 10 is a diagram showing the impressing pattern of an acceleration voltage in the apparatus shown in FIG. 9.

In FIG. 9, the same reference numerals are used to identify the same constituents as in FIG. 7. The difference of this drawing from FIG. 7 lies in that a radio frequency power source 23 having a 385 KHz frequency and an A.C. waveform generator 26 are used as the acceleration voltage application means. The radio frequency power source 23 is connected to the electrode 5 through a synthesizer 25. The A.C. waveform generator 26 is connected to the synthesizer 25. The output waveform controller 27 is connected to the A.C. waveform generator 26.

The synthesizer 25 changes the waveform of the radio frequency voltage outputted from the radio frequency power source 23 in accordance with the waveform 28 outputted from the A.C. waveform generator 26. The output waveform controller 27 controls the period and amplitude of the waveform 38 outputted from the A.C. waveform generator 26.

The etching treatment is carried out by the plasma treating apparatus having the construction described above, that is, the etching apparatus in this case, under the same condition as in the second embodiment. The etching treatment can be carried out stepwise while repeating alternately the etching step and the deposition step in the same way as in the second embodiment.

In other words, the etching action occurs preferentially for the period $t_5$ where the voltage waveform is a negative voltage waveform greater than the critical potential $V_o'$ and the deposition action occurs preferentially for the period $t_6$ where the voltage waveform is the negative voltage waveform smaller than the critical potential $V_o'$.

Incidentally, the etching time $t_5$ and the deposition time $t_6$ can be adjusted easily by changing the period of the waveform 28 outputted from the A.C. voltage waveform generator 26 by the output waveform control means 27. The etching speed at the time of the etching step can be increased easily by changing the amplitude of the waveform 28 outputted from the A.C. waveform generator 26 by the output waveform control means 27. However, it is necessary to simultaneously adjust the amplitude and period of the waveform 28 by the output waveform control means 27 in order to adjust accurately the etching speed, the etching time and the deposition time.

The third embodiment of the invention described above can provide the same effect as that of the second embodiment. Incidentally, in this third embodiment, change-over between etching and deposition proceeds gradually.

Next, the fourth embodiment of the present invention will be described with reference to FIGS. 11 and 12.

Figure 11:
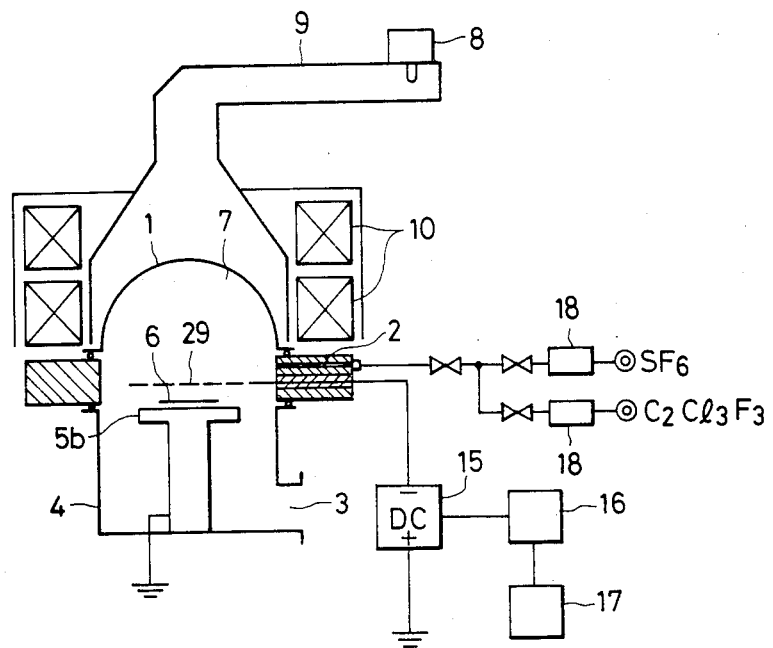
FIG. 11 is a structural view showing the plasma treating apparatus in accordance wihh the fourth embodiment of the present invention.
Figure 12:
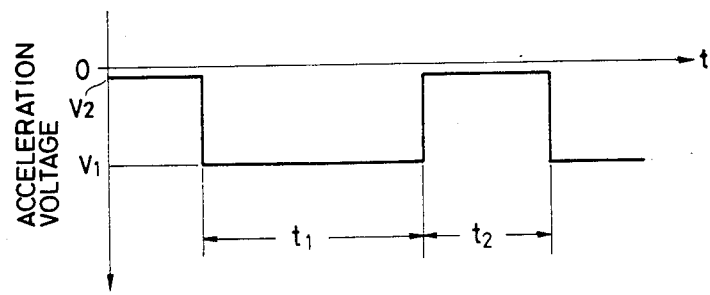
FIG. 12 is a diagram showing the impressing pattern of an acceleration voltage in the apparatus shown in FIG. 11.

In FIG. 11, the same reference numerals are used to identify the same constituents as in FIG. 1. The differences of this drawing from FIG. 1 reside in that the sample table 5b is grounded and that a grid electrode 29 is disposed between the wafer 6 and the discharge space 7. The D.C. power source 15 is connected to the grid electrode 29 and the output voltage controller 16 is connected to the D.C. power source 15. Furthermore, the output waveform controller 17 is connected to the output voltage controller 17.

In this case, a means for accelerating the ions towards the wafer 6 is the D.C. power source 15 that applies the negative D.C. voltage to the grid electrode 29. The negative D.C. voltage outputted from the D.C. power source 15, that is, a means for changing the acceleration voltages interposing the critical potential, consists of the output voltage controller 16 and the output waveform controller 17. These controllers are the same as those of the first embodiment. As shown in FIG. 12, the voltage is controlled to $V_1$ for the period $t_1$ and to $V_2$ during the period $t_2$.

The plasma is generated in the discharge space 7 by use of the plasma treating apparatus having the construction described above, that is, the etching apparatus in this case, under the same condition as in the first embodiment, and the negative D.C. voltage is applied from the D.C. power source 15 to the grid electrode 29. In consequence, the ions in the plasma are accelerated towards the grid electrode 29, and sequentially those ions which pass through the grid electrode 29 reach the wafer 6 and etch the material to be etched of the wafer 6.

At this time, the acceleration voltage $V_1$ greater than the critical potential is outputted from the D.C. power source 15 for the period $t_1$ by the voltage controller 16 and the output waveform controller 17. Consequently, the etching action occurs preferentially for the period $t_1$ and the wafer 6 is etched. Next, the acceleration voltage $V_2$ smaller than the critical potential is outputted from the D.C. power source 15 for the period $t_2$, so that the deposition action occurs preferentially for the period $t_2$ and the protective film is formed on the surface of the wafer 6 (inclusive of the etching side surface). These steps are repeated sequentially and alternately so that the material to be etched of the wafer 6 can be etched stepwise in the same way as in the first embodiment.

In accordance with the fourth embodiment described above, it is possible to carry out alternately the etching step and the deposition step by applying the acceleration voltages to the grid electrode 29 and changing the acceleration voltages interposing the critical potential, without the need of change-over of the gas supply. Therefore, this embodiment provides the effect in that the treating time can be shortened, in the same way as in the first embodiment.

In the same way as in the first embodiment, the fourth embodiment uses the treating method utilizing the microwave plasma, controls the time for the etching step and the time for the deposition step by the output voltage controller 16 and the output waveform controller 17 and carries out etching stepwise while protecting the etching side surface of the wafer 6. Therefore, the material to be etched having a greater depth or height than the pattern dimensional width of a delicate pattern can be etched with high dimensional accuracy.

Since the state of generation of the plasma does not change and etching can be carried out while the light emission intensity remains stable in the same way as in the first embodiment, the end point of etching can be judged easily.

In this fourth embodiment, the D.C. voltage is applied to the grid electrode 29 so that the sample must be electrically conductive. However, insulating samples can be treated, too, if the power source is connected to the grid electrode 29 in the same way as in the first, second or third embodiment.

Next, the fifth embodiment of the present invention will be described with reference to FIG. 13.

Figure 13:
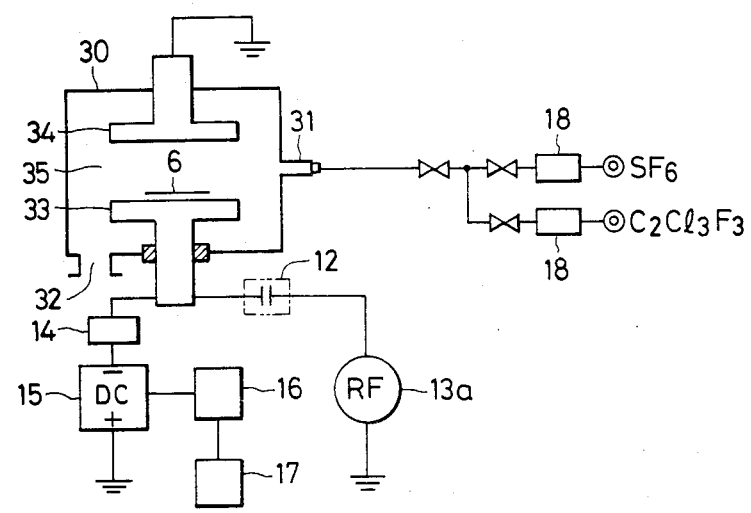
FIG. 13 is a structural view of the plasma treating apparatus in accordance with the fifth embodiment of the present invention.

In FIG. 13, the same reference numerals are used to identify the same constituents as in FIG. 1. The differences of this drawing from FIG. 1 reside in that the apparatus of this drawing is of a parallel flat sheet type RIE apparatus having an upper electrode 34 and a lower electrode 33 inside a vacuum treating vessel 30, that parallel flat sheet type electrodes 33, 34 are used as the plasma generation means and that the radio frequency power source 13a for applying a radio frequency voltage (13.56 MHz in this case) to the electrode 33 is connected to this electrode 33.

A gas introduction port 31 is disposed on the side portion of the vacuum treating vessel 30 and connected to a gas source, not shown, in the same way as in the first embodiment. An exhaust portion 32 is disposed at the lower part of the vacuum treating apparatus and communicated with a vacuum exhaust apparatus which is not shown in the drawing. The lower electrode 33 for supporting thereon the wafer 6 is disposed at the lower inner part of the vacuum treating vessel 30 while the upper electrode 33 is disposed at the upper inner part of the vessel 30 in such a manner as to face the lower electrode 33. The upper electrode 34 is grounded. The lower electrode 33 is fitted to the vacuum treating apparatus 30 through insulating material, and is connected to the radio frequency power source 13a through the matching box 12 and to the D.C. power source 15 through the low-pass filter 14 in the same way as in the first embodiment.

The etching gas is supplied into the discharge space 35 defined between the upper and lower electrodes 34, 33 through the gas introduction port 31 using the plasma treating apparatus having the construction described above (the etching apparatus in this case) in the same way as in the first embodiment. At the same time, the internal pressure of the vacuum treating vessel 30 is evacuated to a predetermined reduced pressure by a vacuum exhaust device not shown. Under this state, a 13.56 MHz radio frequency voltage is applied to the lower electrode 33 by the radio frequency power source 13a, whereby glow discharge develops in the discharge space 35 and the etching gas is rendered plasmic.

Under this state, D.C. bias voltage for accelerating the ions in the plasma towards the wafer 6 has already occurred on the lower electrode 33 in the same way as in the first embodiment. This D.C. bias voltage is changed by the D.C. power source 15 interposing the critical potential in the same way as in the first embodiment. In this manner, the material to be etched can be etched stepwise by alternately repeating the etching step and the deposition step in the same way as in the first embodiment.

According to the fifth embodiment of the invention described above, the etching step and the deposition step can be carried out alternately by changing the D.C. bias voltage interposing the critical potential by the D.C. power source 15 without changing over the supply of the gases. Therefore, this embodiment can shorten the treating time in the same way as in the first embodiment.

In accordance with this embodiment, the stable plasma can be generated in the discharge space 35 between the electrodes 33 and 34 by use of the radio frequency power source 13a and the state of generation of plasma does not change even when the D.C. bias voltage is changed by the D.C. power source 15. Accordingly, the end point of etching can be judged easily in the same way as in the first embodiment.

Furthermore, this embodiment can etch the material to be etched having a high aspect ratio with high dimensional accuracy in the same way as in the first embodiment and can also etch the etching materials whether they may be conductive or insulating materials.

Next, the sixth embodiment of the present invention will be described with reference to FIG. 14.

Figure 14:
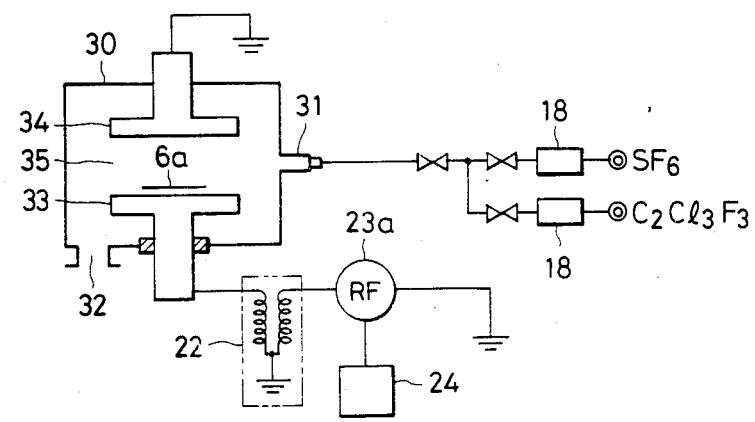
FIG. 14 is a structural view showing the plasma treating apparatus in accordance with the sixth embodiment of the present invention.

In FIG. 14, the same reference numerals are used to identify the same constituents as in FIGS. 7 and 13. The differences of this drawing from FIG. 13 reside in that a radio frequency power source 23a having a frequency below 2 MHz (385 KHz in this case) is used as a means for generating the plasma and that the radio frequency power source 23a having a frequency below 2 MHz is used in common as a means for accelerating the ions. The radio frequency power source 23a is connected to the lower electrode 33 through the matching box 22 in the same way as in FIG. 7. One end of the matching box circuit 22 is grounded so that the lower electrode 33 is at the ground potential D.C.-wise. The output voltage control means 24 is connected to the radio frequency power source 23a.

The control content of the voltage control means 24 is the same as that of the second embodiment. Therefore, the description will be hereby omitted. The wafer 6a has the insulating material in the same way as in the second embodiment.

The etching gas is supplied into the discharge space by use of the plasma treating apparatus having the construction described above, that is, the etching apparatus in this case, in the same way as in the fifth embodiment, and the inside of the vacuum treating apparatus 30 is evacuated to a predetermined reduced pressure. Under this state, a 385 KHz radio frequency voltage is applied to the lower electrode 33 by the radio frequency power source 23a in order to generate glow discharge in the discharge space 35 and to render the etching gas plasmic.

At this time, the radio frequency voltage outputted from the radio frequency power source 23a is changed interposing the critical potential by the output voltage control means 24 in the same way as in the second embodiment, so that the material to be etched of the wafer 6 can be etched stepwise by repeating alternately the etching step and the deposition step in the same way as in the second embodiment.

In accordance with the sixth embodiment described above, since the radio frequency voltage having a frequency below 2 MHz is changed interposing the critical potential, the etching step and the deposition step can be carried out alternately without changing over the supply of gases and the treating time can be therefore shortened in the same way as in the second embodiment.

The material to be etched having a high aspect ratio can be etched with high dimensional accuracy in the same way as in the second embodiment. The sample is suitable for a material having an insulating material. Since the radio frequency voltage of a frequency below 2 MHz, which is also the plasma generation means, is changed, the state of generation of plasma varies between the etching step and the deposition step. Therefore, if the end point of etching is judged by light emission spectroscopy, it is necessary to make judgement by inputting only the light emission intensity when etching occurs.

Next, the seventh embodiment of the present invention will be described with reference to FIG. 15.

Figure 15:
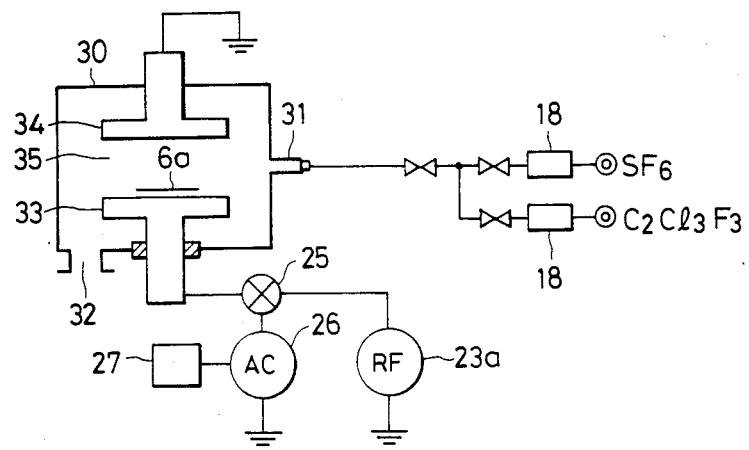
FIG. 15 is a structural view showing the plasma treating apparatus in accordance with the seventh embodiment of the present invention.

In FIG. 15, the same reference numerals are used to identify the same constituents as in FIGS. 9 and 14. The difference of this drawing from FIG. 14 resides in that an A.C. waveform generator 26 is used as a means for changing the radio frequency voltage of the radio frequency power source 23a having a frequency below 2 MHz (385 KHz in this case) interposing the critical potential. The radio frequency power source 23a is connected to the lower electrode 33 through the synthesizer 25 in the same way as in FIG. 9. The A.C. waveform generator 26 is connected to the synthesizer 25, too. The output waveform control means 27 is connected to this A.C. waveform generator 26.

Since the control content of the synthesizer 25, the A.C. waveform generator 26 and the output waveform control means 27 is the same as that of the third embodiment, the description will be hereby omitted.

The etching gas is supplied into the discharge space by use of the plasma treating apparatus having the construction described above, that is, the etching apparatus in this case, in the same way as in the sixth embodiment and the inside of the vacuum treating apparatus 30 is evacuated to a predetermined pressure. Under this state, the controlled radio frequency voltage is applied to the lower electrode 33 in the same way as in the third embodiment or as shown in FIG. 10 in order to generate glow discharge in the discharge space 35 and to render the etching gas plasmic.

Accordingly, the etching action occurs preferentially on the wafer 6a when the radio frequency voltage is greater than the critical potential and the deposition action of the protective film occurs preferentially on the surface (inclusive of the etching side surface) of the wafer 6a when the radio frequency voltage is smaller than the critical potential. Since the etching step and the deposition step are effected alternately, the material to be etched of the wafer 6a can be etched stepwise.

In accordance with the seventh embodiment of the present invention described above, the etching step and the deposition step can be carried out alternately without changing over the supply of the etching gas, and the treating time can be shortened in the same way as in the sixth embodiment.

Incidentally, since the radio frequency voltage which is also the plasma generation means changes always, the plasma generation condition is not constant. Therefore, there is the problem that setting of condition of the etching treatment is difficult.

Next, the eighth embodiment of the present invention will be described with reference to FIGS. 16 and 17.

Figure 16:
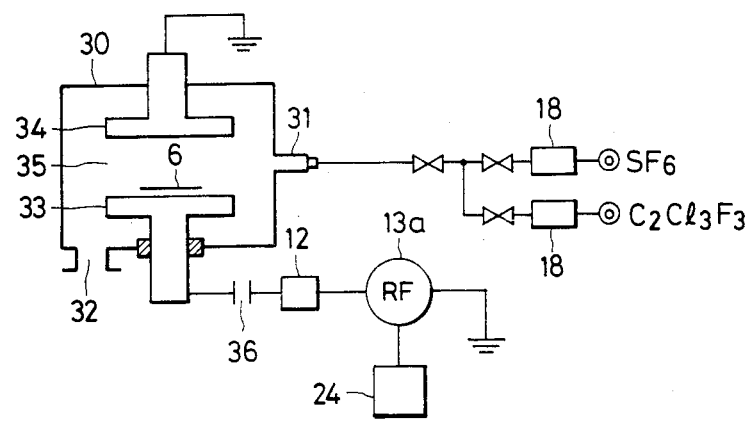
FIG. 16 is a structural view showing the plasma treating apparatus in accordance with the eighth embodiment of the present invention.

In FIG. 16, the same reference numerals are used to identify the same constituents as in FIG. 13. The difference of this drawing from FIG. 13 resides in the plasma generation means. In this case, the output voltage of the radio frequency power source 13a having a frequency of 13.56 MHz can be controlled so that it serves also as a means for changing the ions interposing the critical potential. The radio frequency power source 13a is connected to the lower electrode 33 sequentially through the capacitor 36 and the matching box 12. The output voltage control means 24 is connected to the radio frequency power source 13a.

Figure 17:
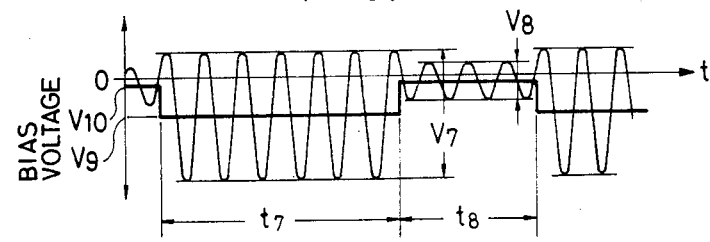
FIG. 17 is a diagram showing the impressing pattern of an acceleration voltage in the apparatus shown in FIG. 16.

The output voltage control means 24 controls the total amplitude of the radio frequency voltage so that the bias voltage of the D.C. component becomes $V_9$ for the period $t_7$ and controls it to $V_8$ so that the bias voltage of the D.C. component becomes $V_{10}$ for the next period $t_8$ as shown in FIG. 17.

The etching gas is supplied into the discharge space 35 by use of the plasma treating apparatus having the construction described above, that is, the etching apparatus in this case, in the same way as in the fifth embodiment and the inside of the vacuum treating apparatus 30 is evacuated to a predetermined pressure. Under this state, the radio frequency voltage is applied to the lower electrode by the radio frequency power source 13a, so that the etching gas is rendered plasmic in the discharge space 35.

At this time, the output voltage control means 24 controls the total amplitude of the radio frequency voltage outputted from the radio frequency power source 13a to $V_7$ for the period $t_7$ as shown in FIG. 17, so that a bias voltage having a D.C. component greater than the critical potential occurs on the sample electrode 33 and the material to be etched of the wafer 6 is etched. For the next period $t_8$, the total amplitude of the radio frequency voltage outputted from the radio frequency power source 13a is controlled to $V_8$, so that a bias voltage having a D.C. component smaller than the critical potential occurs on the sample electrode 33 and the protective film is deposited on the surface of the wafer 6 (inclusive of the etching side surface). The material to be etched of the wafer 6 is etched stepwise by carrying out alternately these etching step and deposition step.

In accordance with the eighth embodiment of the invention described above, since the etching step and the deposition step can be carried out alternately without changing over the etching gas, the treating time can be shortened in the same way as in the fifth embodiment.

Since the output voltage of the radio frequency power source 13a is controlled by the voltage control means 24 and the D.C. bias voltage occurring on the sample electrode 33 is alternately changed while interposing the critical potential, the etching step and the deposition step can be carried out alternately so that the film to be etched having a greater depth or height than the pattern width can be etched with high dimensional accuracy in the same way as in the fifth embodiment.

Even when the radio frequency voltage is controlled, part of the radio frequency voltage has a positive voltage zone. Accordingly, no charge is built up in the wafer 6 in the same way as in the fifth embodiment and etching can be carried out without the drop in etching speed and the degradation or breakdown of the gate portion of the device.

Incidentally, the state of generation of plasma changes between the etching step and the deposition step in the same way as in the sixth embodiment. Therefore, when the end point of etching is judged by light emission spectroscopy, it is necessary to make judgement by inputting only the light emission intensity at the time of occurrence of etching.

Next, the ninth embodiment of the present invention will be described with reference to FIG. 18.

Figure 18:
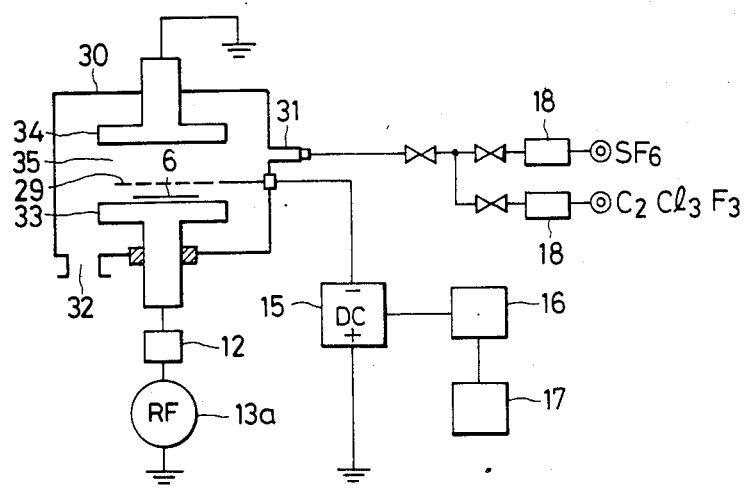
FIG. 18 is a structural view showing the plasma treating apparatus in accordance with the ninth embodiment of the present invention.

In FIG. 18, the same reference numerals are used to identify the same constituents as in FIGS. 11 and 13. The difference of this drawing from FIG. 13 resides in that the grid electrode is disposed between the wafer 6 and the discharge space 35 as a means for accelerating the ions in the same way as in FIG. 11. The D.C. power source 15 is connected to the grid electrode 29 and the output voltage controller 16 is connected to this D.C. power source 15. Further, the output waveform controller 17 is connected to the output voltage controller 16.

Since the control content of the D.C. power source 15, the output voltage controller 16 and the output waveform controller 17 is the same as that of the fourth embodiment, the description will be hereby omitted.

The etching gas is supplied into the discharge space 35 by use of the plasma treating apparatus having the construction described above, that is, the etching apparatus in this case, in the same way as in the fifth embodiment and the inside of the vacuum treating vessel 30 is evacuated to a predetermined pressure. Under this state, the radio frequency voltage is applied from the radio frequency power source 13a to the lower electrode 33, in order to generate glow discharge in the discharge space 35 and to render the etching gas plasmic.

Under this state, the negative D.C. voltage is applied by the D.C. power source 15 to the grid electrode 29 in the same way as in the fourth embodiment. Accordingly, the ions in the plasma are accelerated towards the grid electrode and those ions which pass through the grid electrode 29 reach the wafer 6 and etches the material to be etched of the wafer 6.

At this time, the acceleration voltage applied to the grid electrode 29 is changed interposing the critical potential by the output voltage controller 16 and the output waveform controller 17 in the same way as in the fourth embodiment. Accordingly, when the acceleration voltage is greater than the critical potential, the etching action occurs preferentially on the wafer 6 and when the former is smaller than the latter, the deposition action of forming the protective film on the surface of the wafer 6 (inclusive of the etching side surface) occurs preferentially. The material to be etched of the wafer 6 can be etched stepwise when these etching step and deposition step are carried out alternately.

In accordance with the ninth embodiment of the present invention described above, the etching step and the deposition step can be carried out alternately by changing the acceleration voltage applied to the grid electrode 29 interposing the critical potential, without changing over the supply of the etching gas. Therefore, this embodiment can shorten the treating time in the same way as in the fifth embodiment.

Since etching can be carried out stepwise while protecting the etching side surface of the wafer 6 by the protective film in the same way as in the fifth embodiment, the material to be etched having a depth or height greater than the pattern width can be etched with high dimensional accuracy.

In addition, since the generation state of plasma does not change and etching can be carried out while the light emission state remains stable in the same way as in the fifth embodiment, the end point of etching can be judged easily.

Next, the tenth embodiment of the present invention will be described with reference to FIG. 19.

Figure 19:
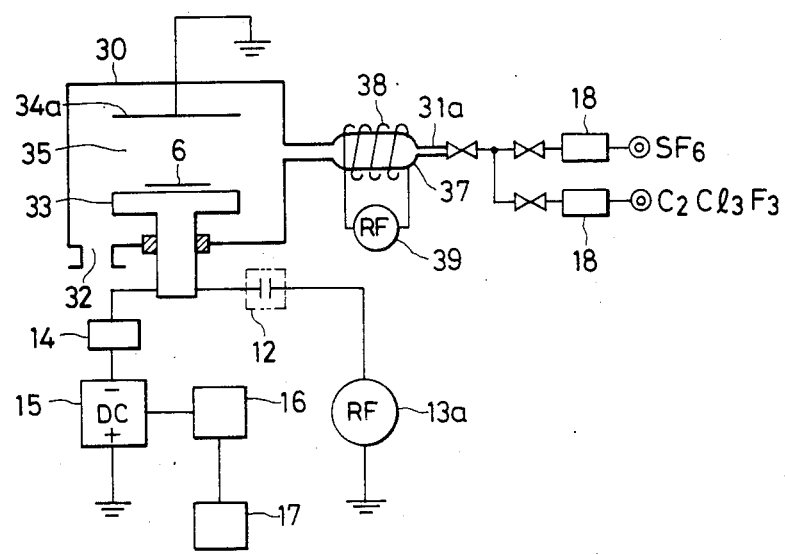
FIG. 19 is a structural view showing the plasma treating apparatus in accordacce with the tenth embodiment of the present invention.

In FIG. 19, the same reference numerals are used to identify the same constituents as in FIG. 13. The difference of this drawing from FIG. 13 resides in that a discharge tube 37 is disposed outside the vacuum treating apparatus 30 as a plasma generation means, and a coil 38 is wound around the outer periphery of the discharge tube 37 and connected to the radio frequency power source 39.

The D.C. bias application means consisting of the radio frequency power source 13a and the D.C. power source 15, that is, the ion acceleration means, is disposed on the lower electrode 33 in the same way as in FIG. 13. The output of each of these plasma generation means and D.C. bias application means can be controlled independently of each other. The radio frequency power source 39 outputs a radio frequency voltage of 800 KHz to 13.56 MHz, for example. The control content of the D.C. bias application means is the same as that of the fifth embodiment and the description will be hereby omitted.

The etching gas is introduced into the discharge tube 37 from a gas source, not shown, through the gas introduction port 31a by use of the plasma treating apparatus having the construction described above, that is, the etching apparatus in this case, and the inside of the vacuum treating apparatus 30 as well as the discharge tube 37 is evacuated to a predetermined pressure. Under this state, the radio frequency voltage is applied from the radio frequency power source 39 to the coil 38, so that the etching gas inside the discharge tube 37 is rendered plasmic and the plasma is introduced into the space 35 of the vacuum treating vessel 30.

At this time the radio frequency voltage is applied to the lower electrode 33 by the radio frequency power source 13a through the matching box 12. Accordingly, the radio frequency voltage applied to the lower electrode 33 floats D.C.-wise and has a D.C. bias voltage in the same way as in the fifth embodiment. The D.C. voltage is superposed with this radio frequency voltage by the D.C. power source 15 to the lower electrode 33 so as to control the D.C. bias voltage.

The D.C. bias voltage is controlled by the output voltage controller 16 and the output waveform controller 17 in the same way as in the fifth embodiment. Accordingly, the etching step and the deposition step can be carried out alternately and the material to be etched of the wafer 6 can be etched stepwise.

In accordance with the tenth embodiment of the present invention described above, the same effect as that of the fifth embodiment can be obtained.

In accordance with this tenth embodiment, further, high density plasma can be generated inside the discharge tube 37 without increasing the radio frequency voltage of the radio frequency power source 13a so that etching can be carried out with less damage and at a higher speed than in the fifth embodiment.

Though the present invention has thus been described with reference to the first to tenth embodiments thereof, the construction of the present invention is not particularly limited to these embodiments. In other words, the plasma generation means and the acceleration voltage application means, and the acceleration voltage application means can naturally be joined with one another in different combinations.

Though the foregoing embodiments uses the mixed gas of $SF_6$ not having the critical potential and $C_2Cl_3F_3$ having the critical potential as the etching gas of polysilicon, other combinations may of course be employed so long as the gas has the critical potential. For instance, it is possible to use the combination of $SF_6$ not having the critical potential with $C_2Cl_4F_2$ ("Flon-114", trade name) having the critical potential or combinations using $NF_3$ in place of $SF_6$.

The components of the etching gas need not necessarily be limited to two gases. In other words, the etching gas may consist of three or more components so long as at least one of them has the critical potential. It is further possible to use combinations of gases all of which have the critical potential or a single gas having the critical potential.

Though the foregoing embodiments illustrate etching of polysilicon, they can be applied to etching of an Al wiring film, and in such a case, it is possible to use a mixed gas of chlorine gas ($Cl_2$) not having the critical potential with $CCl_4$ having the critical potential or a three-component mixed gas further containing $Cl_3$ in addition to the two. Furthermore, it is possible to use $CF_4$, $C_2F_6$, $C_4F_8$ or $SiCl_4$ in place of $CCl_4$ having the critical potential.

Though definite numeric values are not given in FIG. 2, the etching speed or the deposition speed and the critical potential are determined relatively in accordance with the kind of the etching gas, the gas pressure, the output of the plasma generation means, and so forth.

Though the application pattern of the acceleration voltage during the etching treatment is the same in the foregoing embodiment, it is possible to further reduce etching damage by reducing the acceleration voltage within a range greater than the critical potential, at the end of the final etching step.

Though the change-over time of the acceleration voltage while interposing the critical potential is made automatically at a predetermined timing in the foregoing embodiments, it may be changed over automatically at the point of time where each detection value reaches a predetermined set value by detecting the etching state and the deposition state at each stage. Where the number of times of changeover is small, the change-over operation may be made manually.

When these acceleration voltages are set, it is advisable to detect the acceleration voltage, then to display the detected value and to set them to predetermined value while viewing the adjustment value.

Furthermore, though the foregoing embodiments deal with the case where etching is effected, the present invention can be applied to the formation of a film as a whole by reversing the proportion of time between the etching step and the deposition step, that is, the film formation step, and in this case, a flat film can be formed by alternately carrying out the film formation step and the etching step.

As described above, the present invention can carry out alternately the etching step and the film formation step without changing over the etching gas by rendering the gas having the critical potential plasmic and changing the ion acceleration voltage while interposing the critical potential. Accordingly, the present invention provides the effect that the plasma treating time can be shortened.

What is claimed is:

1. A plasma treating method comprising the steps of:
   rendering a gas having a critical potential plasmic under a reduced pressure, said critical potential being a potential at which an etching action and a deposition action are in equilibrium with each other when a sample is treated with the plasma which is generated by rendering a certain kind of gas plasmic under a predetermined plasma condition and applying an acceleration voltage to ions in said plasma so as to let them be incident to said sample; and
   changing said acceleration voltage for accelerating said ions in said plasma towards said sample interposing said critical potential.

2. A plasma treating method according to claim 1, wherein said acceleration voltage is provided by the combination of a D.C voltage and a radio frequency voltage with a frequency having a half cycle time within the time required by said ions in said plasma to pass through an ion sheath.

3. A plasma treating method according to claim 1, wherein said acceleration voltage is provided by a radio frequency voltage with a frequency having a half cycle time from 100 KHz to above the time required by said ions in said plasma to pass through an ion sheath.

4. A plasma treating method according to claim 1, wherein said acceleration voltage is provided by the combination of an A.C. voltage with a low frequency and a radio frequency voltage with a frequency having a half cycle time within the time required by said ions in said plasma to pass through an ion sheath.

5. A plasma treating method according to claim 1, wherein said acceleration voltage is provided by a D.C. voltage.

6. A plasma treating method according to claim 1, wherein said acceleration voltage is a voltage to be applied to a sample table for said sample or a voltage to be applied to a grid electrode disposed between said sample and said plasma.

7. A plasma treating method according to claim 1, wherein said acceleration voltage is changed in such a manner as to interpose said critical potential and is changed, too, during the etching operation.

8. A plasma treating method comprising the steps of:
   rending a gas having a critical potential plasmic under a reduced pressure, said critical potential being a potential at which an etching action and a deposition action are in equilibrium with each other when a sample is treated with the plasma which is generated by rendering a certain kind of gas plasmic under a predetermined plasma condition and applying an acceleration voltage to ions in said plasma so as to let them be incident to said sample; and
   changing said acceleration voltage for accelerating ions in said plasma towards said sample interposing said critical potential and stepwise etching said sample in the direction of depth by carrying out alternately said etching action and said deposition action.

9. A plasma treating method according to claim 8, wherein said etching action takes place within the time at which undercut occurring on said sample is within a range of allowable values and said deposition action takes place within the time at which a film can be formed to a film thickness sufficient to act as a protective film on side surfaces of said sample.

10. A plasma treating method according to claim 8, wherein said gas is either a single gas of $C_2Cl_3F_3$, $C_2Cl_4F_2$, $CCl_4$ or $C_4F_8$ or its mixed gas with $SF_6$ or $NF_3$ when said sample is polysilicon, and said gas is either a single gas of $CCl_4$, $CF_4$, $C_2F_6$, $C_4F_8$ or $SiCl_4$ or its mixed gas with $Cl_2$ when said sample is aluminum.

11. A plasma treating apparatus comprising:
    means for rending a gas having a critical potential plasmic under a reduced pressure, said critical potential being a potential at which an etching action and a deposition action are in equilibrium with each other when a sample is treated with the plasma which is generated by rendering a certain kind of gas plasmic under a predetermined plasma condition and applying an acceleration voltage to ions in said plasma so as to let them be incident to said sample; and
    means for changing said acceleration voltage for accelerating said ions in said plasma towards said sample interposing said critical potential.

12. A plasma treating apparatus according to claim 11, wherein said acceleration voltage is provided by a D.C. power source and a radio frequency power source with a frequency having a half cycle time within the time required by said ions in said plasma to pass through an ion sheath.

13. A plasma treating apparatus according to claim 11, wherein said acceleration voltage is provided by a radio frequency power source with a frequency having a half cycle time from 100 KHz to above the time required by said ions in said plasma to pass through an ion sheath.

14. A plasma treating apparatus according to claim 11, wherein said acceleration voltage is provided by an A.C. power supply with a low frequency and a radio frequency power source with a frequency having a half cycle time within the time required by said ions in said plasma to pass through an ion sheath.

15. A plasma treating apparatus according to claim 11, wherein said acceleration voltage is provided by a D.C. power source.

16. A plasma treating apparatus according to claim 11, wherein said acceleration voltage is provided by a power source applied to a sample table of said sample or a power source applied to a grid electrode disposed between said sample and said plasma.

17. A plasma treating apparatus according to claim 11, wherein said acceleration voltage is changed in such a manner as to interpose said critical potential and is changed, too, during the etching operation.

18. A plasma treating apparatus comprising:
means for rendering a gas having a critical potential plasmic under a reduced pressure, said critical potential being a potential at which an etching action and a deposition action are in equilibrium with each other when a sample is treated with the plasma which is generated by rendering a certain kind of gas plasmic under a predetermined plasma condition and applying an acceleration voltage to ions in said plasma so as to let them be incident to said sample; and
means for changing said acceleration voltage for accelerating ions in said plasma towards said sample interposing said critical potential and carrying out alternately said etching action and said deposition action.

19. A plasma treating apparatus according to claim 18, wherein said gas is either a single gas of $C_2Cl_3F_3$, $C_2Cl_4F_2$, $CCl_4$ or $C_4F_8$ or its mixed gas with $SF_6$ or $NF_3$ when said sample is polysilicon, and said gas is either a single gas of $CCl_4$, $CF_4$, $C_2F_6$, $C_4F_8$ or $SiCl_4$ or its mixed gas with $Cl_2$ when said sample is aluminum.

20. A plasma treating apparatus comprising:
means for rendering a gas having a critical potential plasmic under a reduced pressure by use of the action of an electric field by microwaves and the action of a magnetic field by magnetic field generation means, said critical potential being a potential at which an etching action and a deposition action are in equilibrium with each other when a sample is treated with the plasma which is generated by rendering a certain kind of gas plasmic under a predetermined plasma condition and applying an acceleration voltage to ions in said plasma so as to let thm be incident to said sample;
means for applying said acceleration voltage to a sample table on which said sample is placed; and
means for changing said acceleration voltage interposing said critical potential.

21. A plasma treating apparatus comprising:
a vacuum treating vessel having a discharge tube disposed at an upper opening thereof;
a discharge space within said discharge tube;
a waveguide disposed so as to encircle said discharge tube, said waveguide including a magnetron for generating microwaves;
an electromagnetic coil disposed around the outer periphery of said discharge tube through said waveguide;
an electrode including a sample table disposed within said vacuum treating vessel so as to allow support of a sample to be treated in said discharge space;
a ground electrode disposed around the outer periphery of said electrode and electrically insulated therefrom;
means to introduce gas into said discharge space, said gas having a critical potential at which an etching action and a deposition action of said gas are in equilibrium; and
means to control an acceleration voltage connected to said electrode, for accelerating ions in a plasma of said gas, so as to alternately etch and deposit said sample.

22. A plasma treating apparatus according to claim 21, wherein said means to control an acceleration voltage, comprises:
a radio frequency power source for supplying radio frequency voltage to said electrode, connected to said electrode through a matching box;
a D.C. power source for supplying D.C. voltage to said electrode, connected to said electrode through a lower pass filter;
an output voltage controller connected to said D.C. power source; and
an output waveform controller connected to said output voltage controller.

23. A plasma treating apparatus according to claim 21, wherein said means to control an acceleration voltage, comprises:
a radio frequency power source connected to said electrode through a matching box; and
an output voltage control means connected to said radio frequency power source.

24. A plasma treating apparatus according to claim 21, wherein said means to control an acceleration voltage, comprises:
a radio frequency power source connected to said electrode through a synthesizer;
an A.C. waveform generator connected to said synthesizer; and
an output waveform controller connected to said A.C. waveform generator.

25. A plasma treating apparatus comprising:
a vacuum treating vessel having a discharge tube disposed at an upper opening thereof;
a discharge space within said discharge tube;
a waveguide disposed so as to encircle said discharge tube, said waveguide including a magnetron for generating microwaves;
an electromagnetic coil disposed around the outer periphery of said discharge tube through said waveguide;
an electrode including a sample table disposed within said vacuum treating vessel so as to allow support of a sample to be treated in said discharge space;
means to introduce gas into said discharge space, said gas having a critical potential at which at etching action and a deposition action of said gas are in equilibrium;
means to control an acceleration voltage for accelerating ions in a plasma of said gas, so as to alternately etch and deposit said sample;
said means to control acceleration voltage including a grid electrode disposed in said discharge space above said sample, D.C. power source connected to said grid electrode, an output voltage controller connected to said D.C. power source, and an output waveform controller connected to said output voltage controller.

26. A plasma treating apparatus comprising:
a vacuum treating vessel having a gas injection port;
an upper electrode disposed in an upper portion of said vacuum treating vessel;
a lower electrode for supporting a sample to be treated, disposed in a lower portion of said vacuum treating vessel so as to face said upper electrode, said lower electrode being insulated from said vacuum treating vessel;
means to introduce gas into said vacuum treating vessel through said injection port, said gas having a critical potential at which an etching action and a deposition action of said gas are in equilibrium; and
means to control an acceleration voltage connected to said lower electrode for accelerating ions in a plasma of said gas, so as to alternately etch and deposit said sample.

27. A plasma treating apparatus according to claim 26, wherein said means to control an acceleration voltage, comprises:
- a radio frequency power for supplying radio frequency voltage to said lower electrode, connected to said lower electrode through a matching box;
- a D.C. power source for supplying D.C. voltage to said lower electrode, connected to said lower electrode through a low-pass filter;
- an output voltage controller connected to said D.C. power source; and
- an output waveform controller connected to said output voltage controller.

28. A plasma treating apparatus according to claim 25, wherein said means to control an acceleration voltage, comprises:
- a radio frequency power connected to said lower electrode through a matching box; and
- an output voltage control means connected to said radio frequency power source.

29. A plasma treating apparatus according to claim 26, wherein said means to control an acceleration voltage, comprises:
- a radio frequency power source connected to said lower electrode through a synthesizer;
- an A.C. waveform generator connected to said synthesizer; and
- an output waveform controller connected to said A.C. waveform generator.

30. A plasma treating apparatus according to claim 26, wherein said means to control an acceleration voltage, comprises:
- a radio frequency power source connected to said lower electrode through a matching box and a capacitor; and
- an output voltage control means connected to said radio frequency power source.

31. A plasma treating apparatus according to claim 26, wherein said means to introduce gas includes a discharge tube connected to said injection port and a coil wound around a periphery of said discharge tube and connected to a radio frequency power source.

32. A plasma treating apparatus comprising:
- a vacuum treating vessel having a gas injection port;
- an upper electrode disposed in an upper portion of said vacuum treating vessel;
- a lower electrode for supporting a sample to be treated, disposed in a lower portion of said vacuum treating vessel so as to face said upper electrode, said lower electrode being insulated from said vacuum treating vessel;
- means to introduce gas into said vacuum treating vessel through said injection port, said gas having a critical potential at which an etching action and a deposition action of said gas are in equilibrium; and
- means to control an acceleration voltage for accelerating ions in a plasma of said gas, so as to alternately etch and deposit said sample, said means to control an acceleration voltage including a grid electrode disposed in said vacuum treating vessel above said sample, a D.C. power source connected to said grid electrode, an output voltage controller connected to said D.C. power source, an output waveform controller connected to said output voltage controller, and a radio frequency power source connected to said lower electrode through a matching box.

* * * * *